United States Patent
Kawata et al.

(10) Patent No.: US 6,920,071 B2
(45) Date of Patent: Jul. 19, 2005

(54) SEMICONDUCTOR INTEGRATED CIRCUIT DEVICE

(75) Inventors: Takahiro Kawata, Ome (JP); Shigeru Nakahara, Musasimurayama (JP); Keiichi Higeta, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/845,270

(22) Filed: May 14, 2004

(65) Prior Publication Data

US 2005/0002224 A1 Jan. 6, 2005

(30) Foreign Application Priority Data

Jul. 3, 2003 (JP) ........................................ 2003-270807

(51) Int. Cl.[7] .............................. G11C 7/00; G11C 8/00
(52) U.S. Cl. .............................. 365/189.11; 365/230.06; 365/226
(58) Field of Search ........................ 365/189.11, 230.06, 365/226

(56) References Cited

U.S. PATENT DOCUMENTS 6,269,047 B1 * 7/2001 Kohno ................... 365/230.06
6,385,118 B2 * 5/2002 Fujisawa et al. ............ 365/226

FOREIGN PATENT DOCUMENTS

JP              5-120882         5/1993

OTHER PUBLICATIONS

H. Kawaguchi et al., "A 0.5V, 400MHz, $V_{OO}$–Hopping Processor with Zero–$V_{th}$ FD–SOI Technology", 2003 IEEE International Solid–State Circuits Conference, Session 6, Low–Power Digital Techniques, Paper 6.3, Feb. 10, 2003.

* cited by examiner

Primary Examiner—Trong Phan
(74) Attorney, Agent, or Firm—Miles & Stockbridge P.C.

(57) ABSTRACT

A semiconductor integrated circuit device endowed with memory circuits achieving high operation margin and low energy consumption with high speed and high integration. Composing a memory cell with a MOSFET having a first threshold voltage corresponding to a first voltage and supplying a selection signal corresponding to said first voltage to a word line by a word driver driven at said first voltage. Corresponding to a second voltage smaller than said first voltage, forming a selection signal sending to said word driver by a decoder comprising MOSFET with a second threshold voltage smaller than said first voltage, operating at said first voltage, and installing a first level shifting circuit including inverter circuits that form a selection signal corresponding to said first voltage by receiving a selection signal corresponding to said second voltage. Thereby, high operation margin and low energy consumption with high speed and high integration can be achieved.

8 Claims, 6 Drawing Sheets

US 6,920,071 B2

SEMICONDUCTOR INTEGRATED CIRCUIT DEVICE

CLAIM OF PRIORITY

The present application claims priority from Japanese application JP 2003-270807 field on Jul. 3, 2003, the content of which is hereby into this application.

FIELD OF THE INVENTION

This invention relates to a semiconductor integrated circuit and relates to an effective method applied to a semiconductor integrated circuit consisting, for instance, of miniaturized elements and comprising a logical circuit and a memory circuit.

BACKGROUND OF THE INVENTION

According to a well-known example investigation after this invention had been done, the following patent document 1 was reported as one relating to this invention. In this patent document 1, a memory comprising two power supplies, which supply a higher voltage to a memory cell than the surrounding, is disclosed. In this patent document 1, an applied voltage to a power supply line of a memory cell or a word line is stepped-up, and the conception is different from this invention described later.

[Patent document 1] JP-A 120882/1993

The development of semiconductor technology has been directed toward the miniaturization of elements. With finer element design rules it has become necessary to lower power supply voltage and the MOSFET threshold voltage. The above-mentioned lower MOSFET threshold voltage brings about an increase in leakage current flowing to a drain source of an off-state MOSFET. Therefore, a problem arises in a bit line (or data line) connecting a plurality of static type memory cells which comprise a MOSFET with a low threshold voltage, that is, the operation margin decreases because the difference between a memory current flowing in a selected memory cell and said leakage current flowing in the other non-selected memory cells. Thus, the present inventors investigated a way to maintain said operation margin by increasing the threshold voltage of a MOSFET comprised of a memory cell with finer elements and by decreasing a generated leakage current, resulting in creating the present invention.

SUMMARY OF THE INVENTION

It is an objective of the invention to provide a semiconductor integrated circuit comprising memory circuits which realize maintaining an operation margin and low power consumption by speedup and high integration. The said and other objectives and novel features of this invention will be apparent from the following descriptions and accompanying drawings wherein:

The following is a brief descriptions of typical embodiments disclosed in the present invention.

a) a memory cell is comprised of a MOSFET having a first threshold voltage corresponding to a first voltage,
b) a selection signal corresponding to said first voltage is supplied to a word line by a word driver, which operates at said first voltage,
c) a selection signal transmitting to said word driver is generated by a decoder comprising a MOSFET which corresponds to a second voltage smaller than said first voltage and has a second threshold voltage smaller than said first threshold voltage,
d) a first level shifting circuit including an inverter circuit, which operates at said first voltage and generates a selection signal corresponding to said first voltage by receiving a selection signal corresponding to said second voltage.

This invention provides ways for maintaining operation margin and realizing low power consumption while increasing speed and achieving high integration. It is possible to improve the RAM properties.

DETAILED DESCRIPTION OF THE PREFERRED EMBODIMENTS

Figure 1:
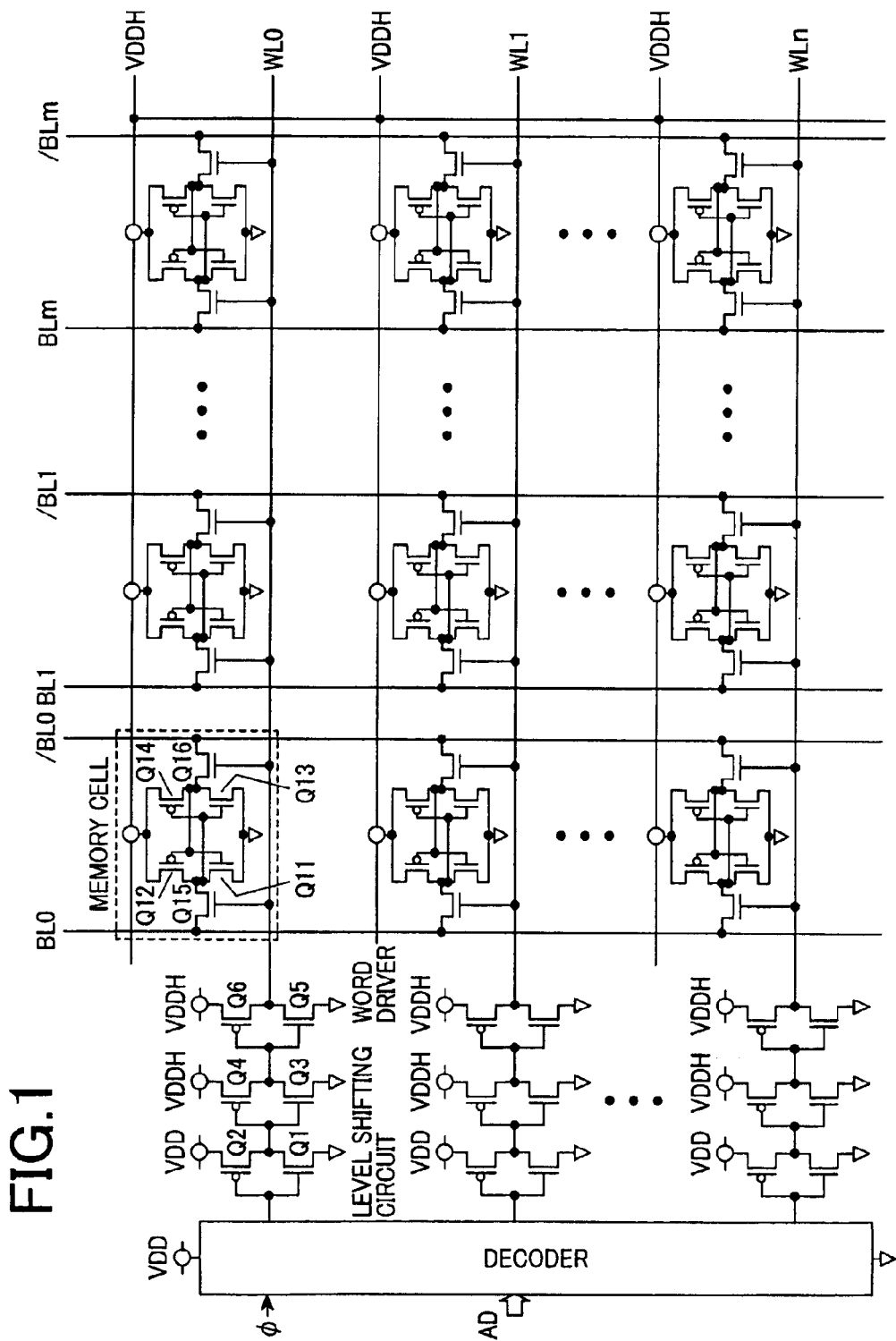
FIG. 1 shows a schematic circuit diagram by a way of example of a memory circuit mounting in a semiconductor circuit device relating in this invention.

FIG. 1 shows a schematic circuit diagram by a way of example of a memory circuit mounted in a semiconductor circuit device related to this invention. In the figure, a memory cell array comprising a memory circuit and a word driver working for selection of the word line are illustrated by way of example. The memory array comprises a plurality of memory cells installed at the cross point of complementary bit lines of BL0/BL0 to BLm/BLm and word lines WL0 to WLn.

As the memory cell, a CMOS latch circuit composed of the intersecting connection of outputs and inputs of two CMOS inverter circuits which consist of N-channel MOSFETQ11, Q13 and P-channel MOSFETQ12, Q14 is used, and CMOS static type memory cell comprised of N-channel MOSFETQ15, Q16 installed between the pair of input/output nodes and the bit line is also used. The gates of said MOSFETQ15 and Q16 are connected with word line WL0 etc. corresponding to them. One source and drain of said MOSFETQ15, Q16 are connected with a pair of input/output nodes of CMOS latch circuit, respectively as described above, and another source and drain are connected with the bit lines BL0,/BL0, respectively.

Although not illustrated, said bit lines BL0,/BL0 to BLm,/BLm are connected with common data lines through the column switch, and the common data lines are connected with an input terminal of a sensing amplifier (read amplifier) and an output terminal of a light amplifier. When reading and writing from one memory cell array with a unit of two or more bits, said bit lines BL0,/BL0 to BLm,/BLm are divided into two or more units and said common data lines, sensing amplifiers and light amplifiers, respectively, are established.

In this embodiment, the MOSFETQ11–Q16 comprising said memory cell are composed of fine elements. For example, the size of the N-channel MOSFET is W/L (channel width/channel length) or 1.0 μm/0.1 μm, and the size of P-channel MOSFET is W/L or 2.0 μm/0.1 μm. Such fine elements bring problems that the leakage current flowing between drain and source of the MOSFET in the off-state increases as described above. For example, a memory current flowing in one said memory cell selected by the selecting action of the word line WL0 and said leakage current flowing in n memory cells corresponding to non-selected word lines WL 1–WL n flow simultaneously in identical bit lines BL0,/BL0, resulting in decreasing the operation margin for reading.

In order to avoid this problem, said operation margin for reading is maintained by increasing the threshold voltage to about 0.6 V using a means of, for example, increasing the impurity content in the channel region leaving the size of said MOSFETQ11–Q16 as described above. The driving voltage applied to the CMOS inverter circuit comprising the memory cell is considered to be high voltage like VDDH corresponding to the high threshold voltage of a MOSFET comprising such memory cells. Said driving voltage VDDH is thought to be about 1.2 V, but it is not specified.

On the other hand, the decoder forming a selection signal of the word line illustrated in a black-box consists of a MOSFET, which has a low threshold voltage, for example 0.4 V, corresponding to said fine elements. Corresponding to such a low threshold voltage, the driving voltage VDD should be a low supply voltage VDD, for example, about 0.8 V. That is, by making the elements fine, peripheral circuits such as decoders are assembled to have a lower supply voltage and lower threshold voltage.

A selection signal generated by said decoder should be a low amplitude signal corresponding to said supply voltage VDD. On the other hand, because the memory cell is considered to be a high voltage VDDH as described above, it is necessary that the selection signal such as the word line WL0 be at a high level corresponding to said driving voltage VDDH. In this embodiment, an inverter type level shifting circuit is adopted due to the speeding-up of the selecting motion of the word line.

It is not specified, but the selection signal generated by the decoder is accepted by the CMOS inverter circuit comprised of N-channel MOSFETQ1 and P-channel MOSFETQ2 driven by a low voltage VDD on the input side, and the signal is reversed and input to the CMOS inverter circuit comprised of N-channel MOSFETQ3 and P-channel MOSFETQ4 driven by a high voltage VDDH, thereby it is converted from a VDD level to a VDDH level. For example, said decoder's low level becomes the selection level and, in the case when it consists of a NAND gate circuit in which the high level is adjusted to be a non-selection level, the level exchange being carried out after reversing the level by installing said inverter circuit (Q1 and Q2).

The word driver consists of N-channel MOSFETQ5 and P-channel MOSFETQ6, and comprises the CMOS inverter circuit driven by a high supply source voltage VDDH. Because the word driver is composed of such an inverting amplifier circuit, a low level input is the selection level, and a level converted signal is needed in which a high level is adjusted to be a non-selection level. In the case when the decoder consists of a NOR gate circuit with a high level being the selection level and a low level the non-selection level, it is possible to omit said inverter circuits (Q1 and Q2), and the decoder output can be directly input into the CMOS inverter circuit which works as a level shifting circuit including N-channel MOSFETQ3 and N-channel MOSFETQ4.

Because said MOSFETQ1 and Q2 are driven at a low voltage VDD as described above, a corresponding low threshold voltage of about 0.4 V is selected. MOSFETQ3, Q4 comprising the level shifting circuit driven at a high supply voltage, and MOSFET Q5, Q6 comprising the word driver are different from the MOSFET Q11–Q16 which comprises memory cells also driven at a high supply voltage, and comprises a MOSFET with a low threshold voltage similar to MOSFETQ1, Q2 driven at said low voltage. The selecting operation of the word line WL0 can be made faster by carrying out the level shifting operation and selecting operation of the word line using MOSFETQ3–Q6 with such a low threshold.

As described above, a system, wherein the word driver comprised of a CMOS inverter circuit and an inverter type level shifting circuit, is placed in the former steps, the advantage of low power consumption is achieved. That is, as described in this embodiment, when the number of memory cell arrays is n+1 like the word line WL0–WLn, one word line is selected and the remaining n word lines are not selected. A row level input signal is supplied to the input of the word driver of the selected word line and a high level input signal is supplied to the input of the word driver of the non-selected word line.

At the inverter type level shifting circuit, an output signal with said low level and n high level output signals are generated. At the inverter type level shifting circuit, because the high level of the input signal corresponds to the level of supply voltage VDD, only the supply voltage VDD (0.8 V) is applied to the gate of P-channel MOSFETQ4 when said low level output signal is generated. Therefore, a voltage of 1.2−0.8=0.4 (V), corresponding to said threshold voltage 0.4 V, is applied between the source and gate of MOSFETQ4 on which said high supply voltage VDDH (1.2 V) is applied, thereby maintaining the on-state. That is, in this level shifting circuit, a low level output signal is generated corresponding to the conductance ratio of N-channel MOSFETQ3 with a voltage of 0.8 V between the gate and source by applying said supply voltage VDD to the gate against P-channel MOSFETQ4 with a voltage of 0.4 V between the gate and source as described above.

Because the output signal generated with such a level shifting circuit is a level considered to be a low level for the logic threshold voltage of CMOS inverter circuit (Q5 and Q6) comprising the word driver, it is amplified in the word driver to form the high level selection signal corresponding to high supply voltage VDDH, and it is transmitted to the word line WL0. Therefore, in the inverter type level shifting circuit, direct current is passed through said P-channel MOSFETQ4 and N-channel MOSFETQ3.

However, a selection signal of one word line of said n+1 word lines WL0–WL1 is generated in the decoder by accessing an address signal AD. Therefore, said direct current only flows through the shifting circuit corresponding to the one selected word line. On the other hand, because non-selected signals are output to the remaining n word lines in said decoder, said low level input signal is supplied to the corresponding n level shifting circuits, thereby P-channel MOSFETQ4 becomes on-state and N-channel MOSFETQ3 becomes off-state to form a converted high level output signal corresponding to the high supply voltage VDDH as described above, and direct current does not flow as described above. Because of this, a practical problem never arises.

The period where direct current flows to the said level shifting circuit can be limited by driving the selection operation of the word line in pulse operation, but it is not specified. For instance, pulse φ is supplied to the decoder and the output period of the selection signal generated by said decoder is limited by this pulse φ. According to the selecting operation by said word line, the pulse width of this pulse φ will be effective only for a period necessary for amplifying the memory information from the selected memory cell by the sensing amplifier (or lead amplifier), not shown in the figure, and for writing the information from the light amplifier to said memory cell. As a result, the period when the word line is put into the selection state is decided depending on the pulse width of said pulse φ, and the period where direct current flows in the level shifting circuit corresponding to the selection operation can be limited by assuming all word lines to be at a non-selection level for other periods.

Although it is not illustrated in the figure, the column selection signal supplied to the column switch that carries out the selecting operation of said bit line is also made a high level corresponding to the VDDH. Because the decoder which deciphers the Y system address signal operates by a low voltage VDD as well as the decoder forming the selection signal of said word line, the level of said column selection signal is also shifted by the inverter type level shifting circuit similar to the one described above.

Figure 2:
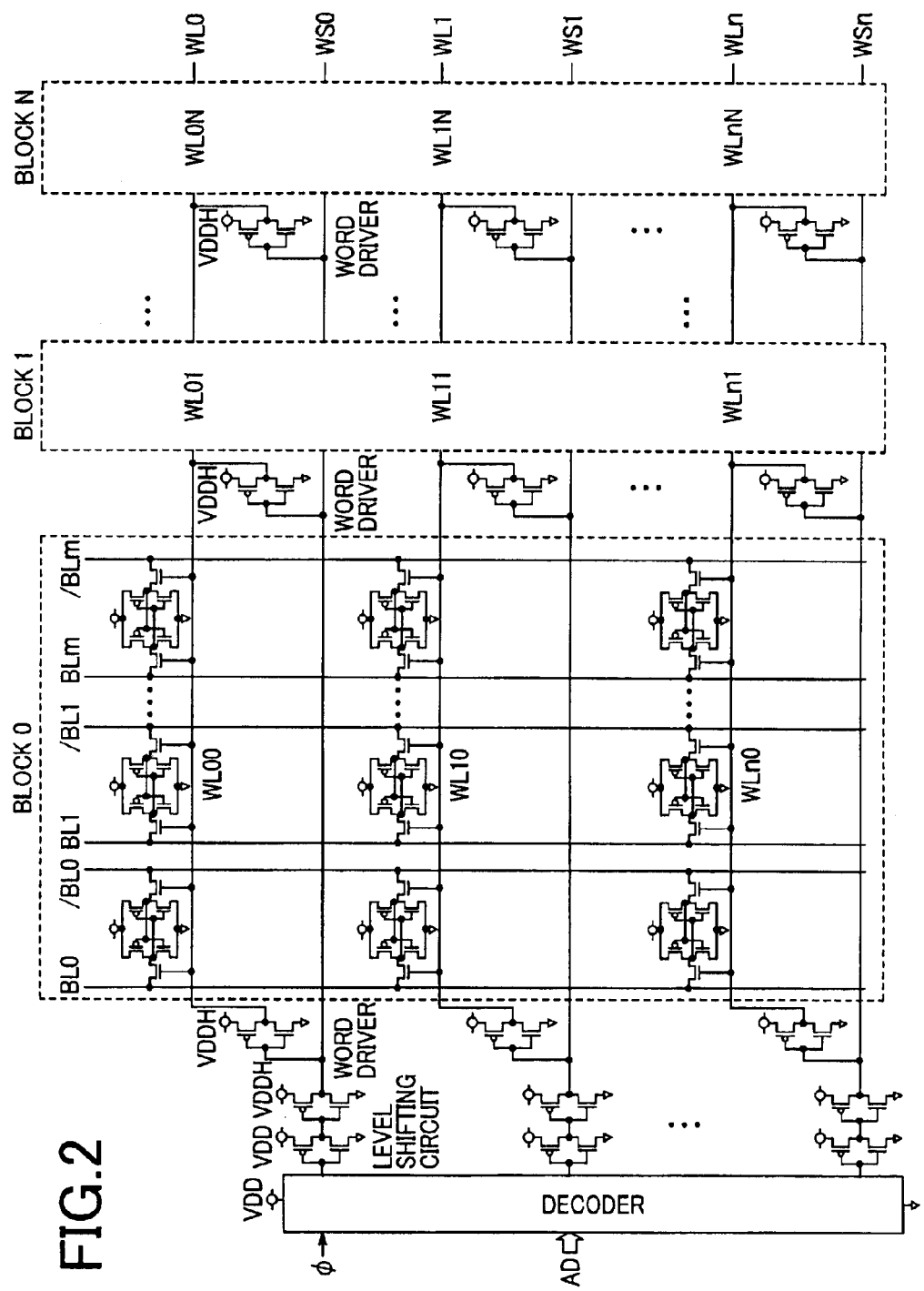
FIG. 2 shows a schematic circuit diagram by another example of a memory circuit mounting in a semiconductor circuit device relating in this invention.

FIG. 2 shows a schematic circuit diagram by another example of a memory circuit mounted in a semiconductor circuit device related to this invention. In the figure, a memory cell array comprising a memory circuit and a word driver working for selection of the word line are also illustrated by way of example. A memory cell array comprises memory blocks such as block O and block N in the direction of a word line. One block O comprises memory cells installed at the each cross point of complementary bit lines of BL0,/BL0 or BLm,/BLm and word lines WL0 or WLn.

The structure of block 1 or block N is the same as that of block O and, although it is not shown, each comprises (i+1) pairs of complementary bit lines such as complementary bit lines of BL0,/BL0 or BLm,/BLm, respectively. The word line WL0–WLn is extended through said block 0 or block N, but it is not specified. Word drivers are arranged corresponding to each said block 0-block N.

The input terminal of each word driver distributed to the mentioned one of the word line WL0 is connected commonly to the selection signal line WS0 which transmits the signal generated at the level shifting circuit. The selection signal lines WS1–WSn are provided as above described to the other word line WL1–WLn. As above described, because the word lines WL0–WLn are extended through the block 0–block N respectively, the selection signal lines WS0–WSn corresponding to the each word line are similarly provided.

In this configuration, a lot of memory cells connecting to the word line WL0 are divided into two or more blocks and selection operation of word line is carried out by distributed two or more word driver, thereby selection operation of the word line can be made faster collectively. That is, the selection signal line WS0 extended to two or more block 0-N drives only the said word driver; therefore, it is possible to make it to the selection level at high speed. Receiving this, said each driver operates and drives allotting said word line WL0, therefore the selection operation of word line as the whole can be done at high speed On the other hand, in the embodiment of FIG. 1, the memory cell provided next to the word driver may be selected at high speed if the number of memory cell connected to the word line WL0 is same as that of the embodiment shown in FIG. 2. However, because a memory cell placed far end side from the word line WL0 has a larger parasitic capacitance corresponding to the number of memory cell connecting with the word line WL0, the spread of the selection signal generated with the word driver becomes slower. Since the memory cycle depends on the selection operation of the slowest memory cell located the far end side of said word line, adopting the configuration shown in the embodiment of FIG. 2 make it shorten the memory cycle.

For instance, in the case selecting one block out of said block 0–block N and doing read and write, the word lines WL0–WLn may be electrically separated and arranged in each of block 0–block N. In this case, if the said word line is selected in X address, the block selection signal generated with Y address is generated, and the selection signal supplied from said selection signal line WS and block selection signal are supplied to said word driver. This configuration is a so-called hierarchical word line method. Thai is, the word line WL provided to each block 0–block N and connected with said memory cell is assumed to be the sub-word lone SWL, and the selection signal line WS arranged lying across tow or more blocks is assumed to be the main word line MWL.

Figure 3:
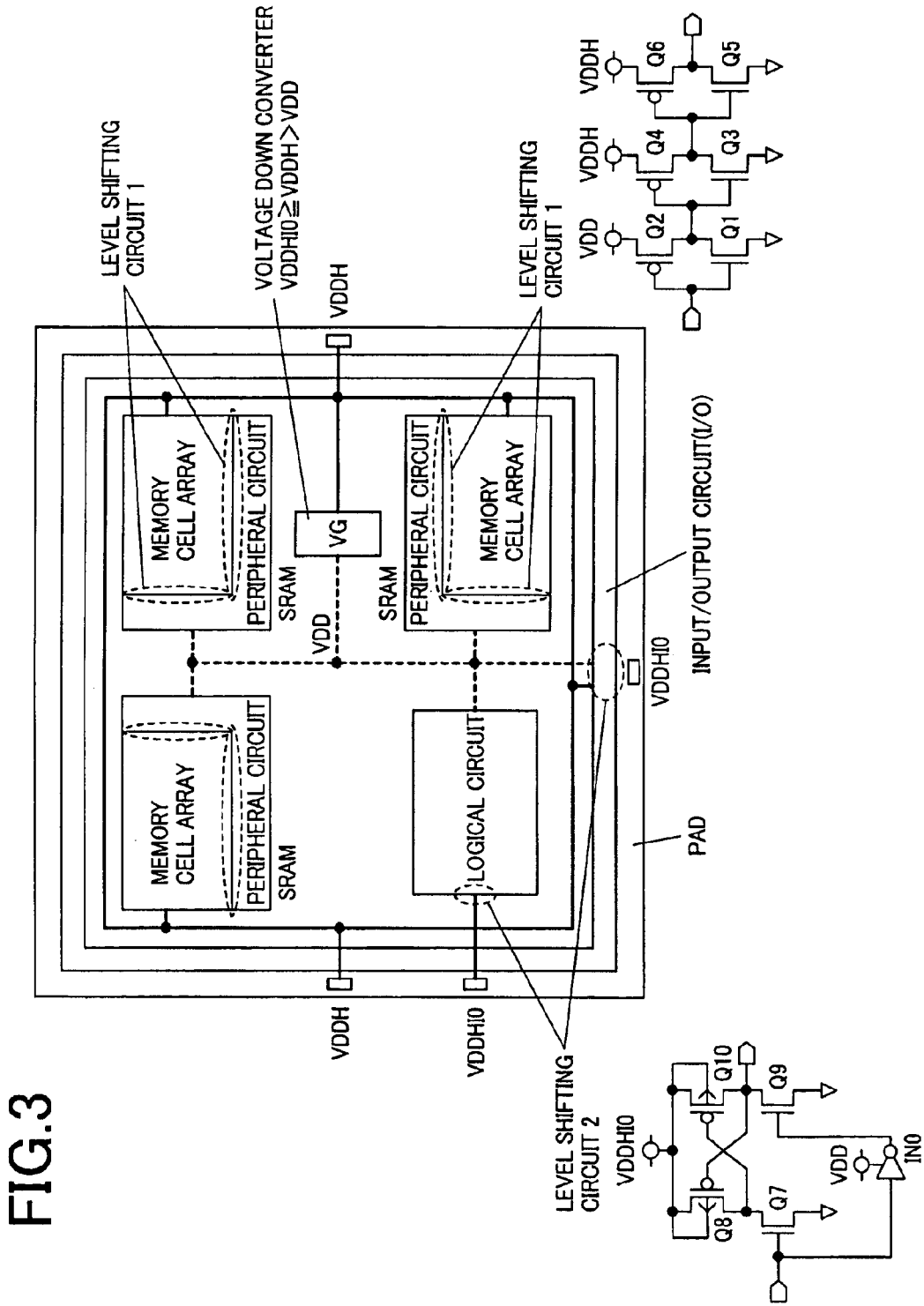
FIG. 3 shows a whole block diagram by a way of example of a semiconductor circuit device relating in this invention.

FIG. 3 shows a whole block diagram by a way of example of a semiconductor circuit device relating in this invention. A semiconductor integrated circuit device in this embodiment comprises three SRAMs (static type RAM), a logical circuit that consists of the user logic etc. to control them, and a voltage down converter VG and input/output circuit (I/O), but it is not specified. Said SRAM comprises peripheral circuits such as memory array and decoder etc., as embodiments shown in said FIGS. 1 and 2, and the inverter type level shifting devise 1 comprised of above-described MOSFETQ1–Q6 is provided to exchange the level between VDD and VDDH. Said word driver is also contained in this level shifting circuit.

Two kinds of supply voltages such as VDDH and VDDHI are supplied to the semiconductor integrated circuit in this embodiment from the external terminals. The voltage down converter VG generates a step-down voltage such as VDD according to said supply voltage VDDH. This step-down voltage VDD is supplied as an operation voltage of peripheral circuits and logical circuits such as a decoder etc. of said SRAM. Moreover, the voltage is supplied to the input/output circuit (I/O) as on of the operation voltage. An area to arrange the pads PAD is provided surrounding the chips. Power supply terminals VDDH and VDDHIO are shown as a representative illustrating it among these pads PAD.

Said VDDHIO is supplied as a part of operation voltage to the level shifting circuit 2 installed in the input/output circuit (I/O) and the logical circuit. A voltage corresponding to the signal level of the system side where the input/output circuit (I/O) is mounted is assumed to be supplied, but it is not specified. Therefore, the relationship of each voltage is controlled to be VDDHIO ≧VDDH>VDD. That is, the case VDDHIO=VDDH may be possible, but signal exchange suitable for the system becomes possible by installing the supply terminals dividing as described in this embodiment and supplying said VDDHIO corresponding to the system on which it is mounted.

Because this embodiment is assumed to use a relatively large signal level corresponding to said supply voltage VDDHIO, cross-couple type level shifting circuit is adopted as said level shifting circuit 2 concerning the case of VDDHIO>VDDH, which is different from the inverted type level shifting circuit used for said level shifting circuit 1 of SRAM. That is, gate and drain of P-channel MOSFETQ8 and Q10 are cross-connected (cross-couple) and the supply voltage VDDHIQ is supplied to the source. N-channel MOSFETQ7 and Q9 are installed between the drains of said MOSFETQ8, Q10 and the earthed voltage of the circuit. An input signal is supplied to the gate of said MOSFETQ7 and reversed said input signal by the inverter circuit IN0 is supplied to the gate of MOSFETQ9.

Following is the operation of the cross-couple type level shifting circuit. When the input signal is a low level, N-channel MOSFETQ7 becomes in off-state and N-channel MOSFETQ9 becomes on-state. On-state of said MOSFETQ9 makes the gate voltage of the P-channel MOSFETQ8 a low level and said MOSFETQ8 becomes on-state. On-state of said MOSFETQ8 makes the gate voltage of the P-channel MOSFETQ10 a high level corresponding to the operation voltage VDDHIO, and said MOSFETQ10 becomes off-state. Therefore, P-channel MOSFETQ10 becomes off-state and the output signal becomes a low level because of off-state of said N-channel MOSFETQ7.

When the input signal changes from a low level to a high level, N-channel MOSFETQ7 becomes on-state and N-channel MOSFETQ9 becomes off-state. The gate voltage of P-channel MOSFETQ 10 is decreased depending on a middle potential decided from a conductance ratio of on-state of said MOSFETQ7 and on-state of said P-channel MOSFETQ8, the output signal is started up in the high level by flowing a current to the source-drain, and conductance of said P-channel MOSFETQ8 in on-state is reduced.

As a result, decrease of the middle potential acceding to the conductance ratio of MOSFETQ7 and Q8 increases the current flowing said MOSFETQ10, thereby said MOSFETQ8 is made off-state by the action of the positive feedback loop of decreasing the said middle potential more and more, resulting in outputting a high level corresponding to the operation voltage VDDHIO by on-state of MOSFETQ10. Thus, a high level of input signal such as about 0.8V corresponding to the operation voltage VDD is level-converted (level-shift) into a higher level output signal such as 1.2V or more corresponding to said operation voltage VDDHIO by the cross-couple type level shifting circuit.

Circuits in a semiconductor integrated device excepting for SRAM, for example input/output circuit (I/O), are necessary to be level-converted. In this case, because high-speed operation is not demanded compared with SRAM and no pulse operation like the word line selection, above-described direct current being generated by said level conversion can be inhibited by using said cross-couple type level shifting circuit. In addition, the amplitude difference of the input/output circuit (I/O) of the level shifting circuit is sometimes larger than the amplitude difference of input/output of the word driver in said SRAM (VDDHIO>VDDH) in a general condition, therefore a cross-couple type level shifting circuit which generates less direct current is suitable.

Figure 4:
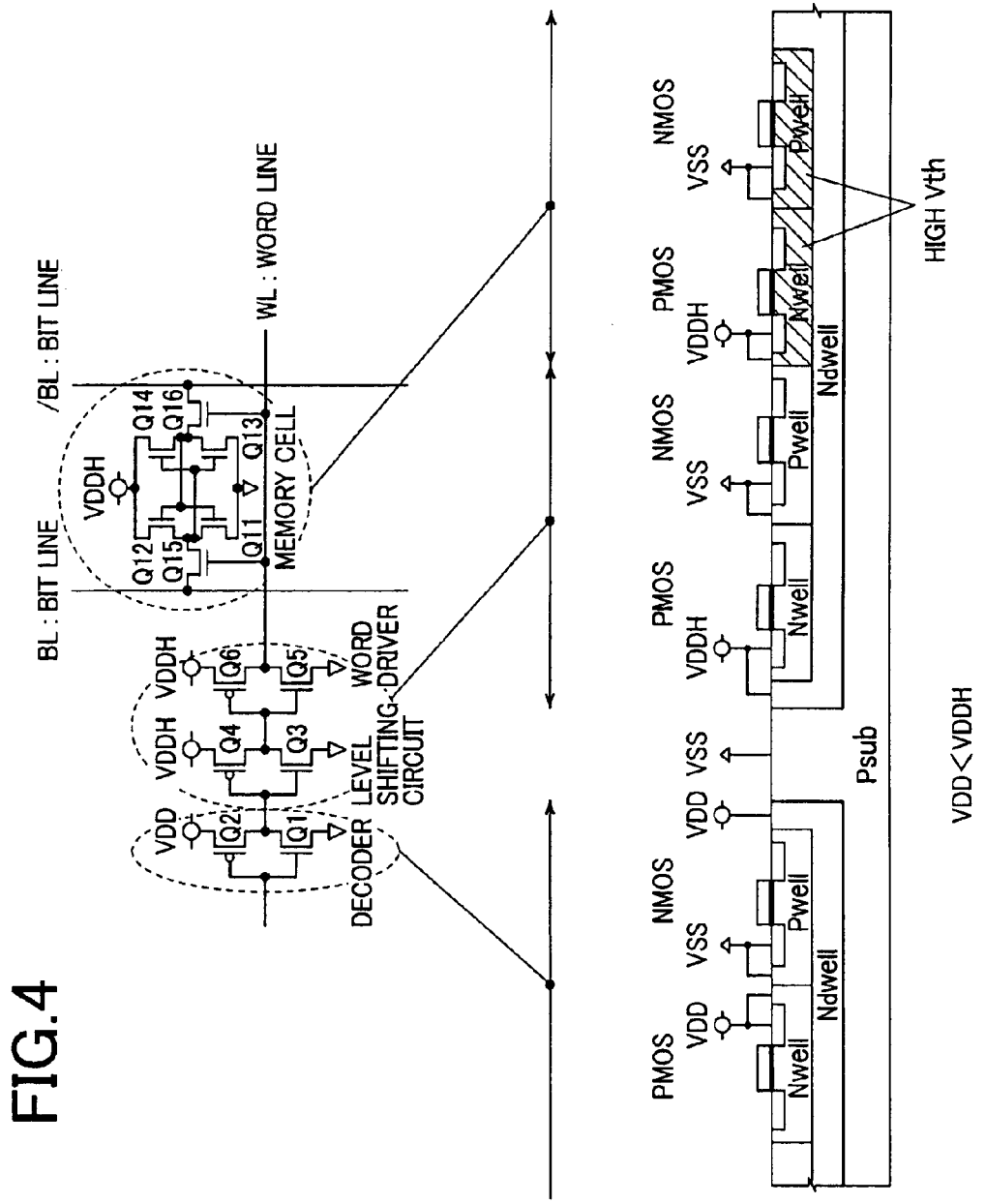
FIG. 4 shows an explanation diagram by a way of example of a memory part mounting in a semiconductor circuit device relating in this invention.

FIG. 4 shows an explanation diagram by a way of example of a memory circuit mounting in a semiconductor circuit device relating in this invention. A circuit composing a word line selection circuit and the memory cell in the memory part and the element cross sectional structure corresponding to it are shown in this figure. CMOS inverter circuit comprising N-channel MOSFETQ1 and P-channel MOSFETQ2 which is driven at a low voltage VDD is described as a part comprised of a level shifting circuit in above-described embodiment. However, in this embodiment, it is shown as a representative of circuits operated by a low voltage VDD such as a decoder etc.

A triple well configuration is adopted in the semiconductor integrated circuit device shown in this embodiment. That is, N-type well region Ndwell made deep depth is formed in the element formation area of P type semiconductor substrate Psub. In said well region Ndwell, P-type well Pwell in which N-channel MOSFET (NMOS) is formed and N-type well Nwell in which P-channel MOSFET (PMOS) is formed are provided respectively. Said N-type well region Ndwell is installed independently corresponding to said low voltage VDD and high voltage VDDH.

VDD is supplied as a bias-voltage to the deep N-type well region Ndwell in which N-channel and P-channel MOSFETs driven by a low voltage VDD are formed, and VDDH is supplied as a bias-voltage to the deep N-type well region Ndwell in which N-channel and P-channel MOSFETs driven by a high voltage VDDH are formed. VDD is supplied as a bias-voltage to the N-type well region Nwell in which P-channel MOSFET driven by a low voltage VDD are formed, the earth voltage of the circuit VSS is supplied as a bias-voltage to the P-type well region Pwell in which N-channel MOSFET id formed. VDDH is supplied as a bias-voltage to N-type well region Nwell in which P-channel MOSFET is formed, and the earth voltage of the circuit VSS is supplied as a bias-voltage to the P-type well region Pwell in which N-channel MOSFET id formed.

A bias-voltage is applied to the MOSFETQ1 and Q2 driven at said low voltage VDD and MOSFETQ4–Q6 driven at said high voltage to be electrically separated by said PN junction separation. Similarly, MOSFETQ11–Q16 composing the memory cell driven at a high voltage may be formed in the deep N-type well region Ndwell same as said MOSFETQ4–Q6. But, it may be formed in other N-type well region Ndwell.

Said OSFETQ1–Q6 and Q11–Q16 are formed to the size such as said 0.1 μm which is a minute size of the channel length L. A high threshold voltage (high Vth) is provided to MOSFETQ11–Q16 comprising the memory cell to maintain reading margin by decreasing said leakage current. On order to provide such a high voltage, N-type impurity concentration using an ion implantation technology etc. is selectively introduced in the N-type well Nwell in which P-channel MOSFET (PMOS) is formed, and P-type impurity concentration using an ion implantation technology etc. is selectively introduced in the P-type well Pwell in which N-channel MOSFET (PMOS) is formed. According to the selective introduction of impurities, for example, MOSFETQ1–Q6 is provided to have a low threshold voltage like the absolute value of 0.4V as above-described, but MOSFETQ11–Q16 comprising the memory cell is provided to have a high threshold voltage like the absolute value of 0.6V.

Figure 5:
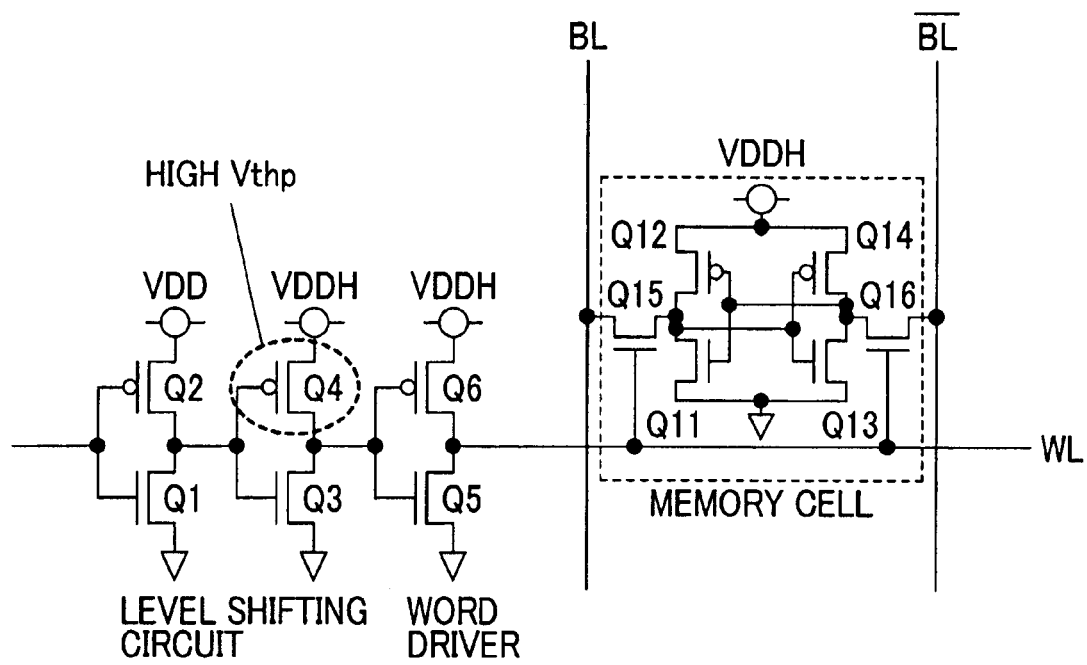
FIG. 5 shows a key parts diagram by a way of example of a memory part mounting in a semiconductor circuit device relating in this invention.

FIG. 5 shows a key part of a circuit diagram by a way of example of a memory circuit mounting in a semiconductor circuit device relating in this invention. In this figure, a circuit diagram comprising a word line selection circuit of memory part and a memory cell. In this embodiment, a high threshold (high Vth) such as 0.6V as shown in an embodiment in said FIG. 4 is provided to P-channel MOSFETQ4 comprising the level shifting circuit. For instance, as above-described, an internal circuit such as MOSFETQ1 and Q2 is driven at a low voltage VDD, and a low threshold such as about 0.4V is provided as the threshold corresponding to it. MOSFETQ11–Q16 which compose the memory cell driven at a high voltage VDDH are provided to be a high threshold voltage such as about 0.6 V as above-described, and operated at a high voltage VDDH (1.2 V).

In the inverter type level shifting circuit in this embodiment, the high level of input signal is the one corresponding to the supply voltage, therefore only the supply voltage VDD (0.8 V) is applied to the gate of P-channel MOSFETQ4. That is, the voltage of 1.2−0.8=0.4 (V) is applied between the source and gate of MOSFETQ4 to which said high supply voltage VDDH (1.2 V) is applied. In this embodiment, the threshold voltage of said MOSFETQ4 is set to a high Vth such as absolute value of 0.6 V, thereby it is possible to keep it off and said direct current can be prevented being generated.

Figure 6:
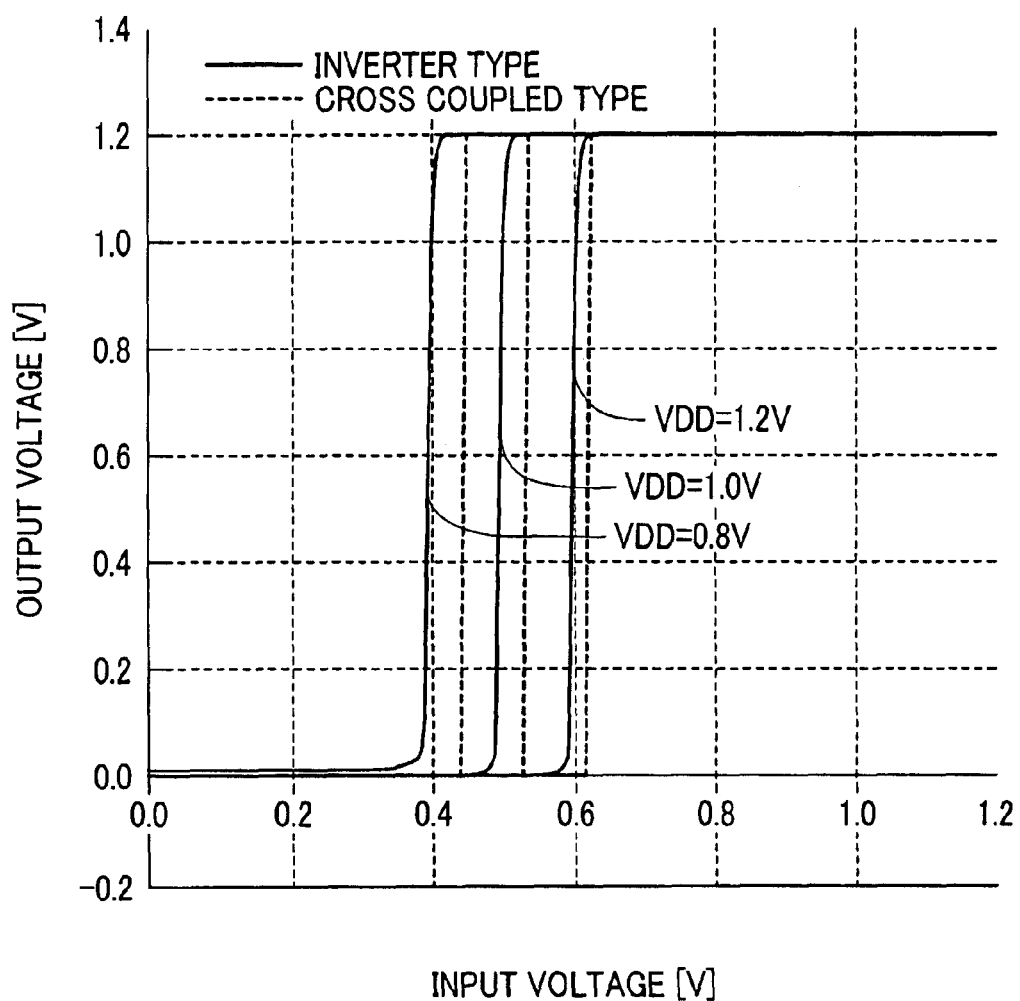
FIG. 6 shows the input-output characteristic of the inverter type and cross-couple type level shifting circuits used in this invention.

FIG. 6 shows the input-output characteristic of the inverter type and cross-couple type level shifting circuits used in this invention. The solid line shows the input-output characteristics of inverter type level shifting circuit and the dotted line shows those of cross-couple type level shifting circuit. In this figure, the level conversion signal is 1.2 V and three examples of input signals being 0.8 V, 1.0 V, and 1.2 V, are shown.

Although the signal flow times of inverter type and cross-couple type are not directly shown in this figure of input-output characteristics, the logic threshold voltage of inverter type is smaller than that of cross-couple type. It indicated that the output signal is converted from a low level to a high level in a high speed when the input signal changed from a low level to a high level. In the cross-couple type level shifting circuit, the positive feedback loop works to maintain a previous state until it reaches logic threshold, resulting in delaying the change of output signal. From this viewpoint, it may be understood that the signal propagation delay time of the inverter type level shifting circuit becomes shorter.

Above we have illustrated the invention of the present inventors on the basis of the preferred embodiments. However, it is to be understood that the invention is not intended to be limited to the specific embodiments and variation may be made by one skilled in the art without departing from the scope of the invention. For instance, in the level shifting circuit illustrated in FIG. 1, the inverter circuit consisted of MOSFETQ1 and Q2 may be substituted with a double inputted gate circuit and said φ is supplied to it, thereby a function of controlling the period of word line selection by the pulse operation may be added. Besides controlling the impurity content of the channel region of the MOSFET described above, forming the thickness of the gate insulator in thicker and combining the both means may be accepted for a means of making the threshold voltage of the memory cell higher than that of the MOSFET comprising the peripheral circuits and other logical circuits. This invention provides a way to widely use various kinds of semiconductor integrated circuit devices having memory circuits including SRAM.

What is claimed is:

1. A semiconductor integrated circuit device comprising:
   a plurality of memory cells each including a MOSFET which operates at a first voltage and has a first threshold voltage corresponding to said first voltage;
   a word line connected to said plurality of memory cells;
   a word driver that operates at said first voltage and generates a word line selection signal corresponding to said first threshold voltage;
   a decoder including a MOSFET which operates at a second voltage lower than said first voltage and has a second threshold voltage lower than said first voltage, and generating a selection signal which is transmitted to said word driver; and
   a first level shifting circuit including an inverter circuit which operates at said first voltage, and generating a level-shifted selection signal corresponding to said first voltage by receiving a selection signal corresponding to said second voltage.

2. A semiconductor integrated circuit device according to claim 1, wherein the MOSFET with said first threshold voltage and the MOSFET with said second threshold voltage have different impurity densities in semiconductor layers comprising respective channel regions thereof.

3. A semiconductor integrated circuit device according to claim 2, wherein said inverter circuit comprises a P-channel MOSFET with said first threshold voltage and an N-channel MOSFET with said second threshold voltage.

4. A semiconductor integrated circuit device according to claim 2, wherein said word line is placed corresponding to a plurality of blocks, each including a plurality of said memory cells, the device further comprising:
   at least one additional word driver such that each block is associated with a corresponding word driver; and
   a selection signal line which transmits said level-shifted selection signal to each said word driver.

5. A semiconductor integrated circuit device according to claim 2, further comprising:
   an input-output circuit that operates at said first voltage or a third voltage which is the same or greater than the first voltage; and
   a second level shifting circuit that level shifts an internal signal corresponding to said second voltage to an external output signal corresponding to said third voltage,
   wherein said second level shifting circuit includes first and second P-channel MOSFETs with a latch configuration, a source being connected with said third voltage; a signal input corresponding to said second voltage; and first and second N-channel MOSFETs where a reversed signal is supplied to a gate, and wherein said second level shifting circuit is comprised of a cross-couple type level shifting circuit, and wherein drains of said first P-channel MOSFET and said first N-channel MOSFET are connected in common, and drains of said second P-channel MOSFET and said second N-channel MOSFET are connected in common.

6. A semiconductor integrated circuit device according to claim 5, wherein said first level shifting circuit comprises a first CMOS inverter circuit, which receives a selection signal generated by said decoder and operates at said second voltage; and a second CMOS inverter circuit, which operates at said first voltage and forms a selection signal transmitted to said word driver.

7. A semiconductor integrated circuit device according to claim 4, wherein said first voltage is supplied by external terminals and said second voltage is generated with an internal power supply circuit stepping-down said first voltage.

8. A semiconductor integrated circuit device according to claim 5, wherein said first voltage and said third voltage are supplied by external terminals.

* * * * *